(12) United States Patent
Tadayon et al.

(10) Patent No.: US 12,087,658 B2
(45) Date of Patent: Sep. 10, 2024

(54) HYBRID THERMAL INTERFACE MATERIAL (TIM) WITH REDUCED 3D THERMAL RESISTANCE

(71) Applicant: INTEL CORPORATION, Santa Clara, CA (US)

(72) Inventors: Pooya Tadayon, Portland, OR (US); Joe Walczyk, Tigard, OR (US)

(73) Assignee: Intel Corporation, Santa Clara, CA (US)

(*) Notice: Subject to any disclaimer, the term of this patent is extended or adjusted under 35 U.S.C. 154(b) by 952 days.

(21) Appl. No.: 16/889,562

(22) Filed: Jun. 1, 2020

(65) Prior Publication Data
US 2021/0375716 A1 Dec. 2, 2021

(51) Int. Cl.
*H01L 23/373* (2006.01)
*H01L 23/42* (2006.01)
*H01L 23/40* (2006.01)

(52) U.S. Cl.
CPC ...... *H01L 23/3733* (2013.01); *H01L 23/3736* (2013.01); *H01L 23/3737* (2013.01); *H01L 23/42* (2013.01); *H01L 23/4006* (2013.01)

(58) Field of Classification Search
CPC ............. H01L 23/3733; H01L 23/3736; H01L 23/3737; H01L 23/42
See application file for complete search history.

(56) References Cited

U.S. PATENT DOCUMENTS

| | | | | |
|---|---|---|---|---|
| 2004/0118501 A1* | 6/2004 | Chiu | ............... | H01L 21/4871 257/E23.09 |
| 2004/0262372 A1* | 12/2004 | Houle | ............... | H01L 23/3733 257/E23.09 |
| 2014/0217574 A1* | 8/2014 | Kuczynski | ............... | H01L 25/0657 264/108 |
| 2018/0063996 A1* | 3/2018 | Vitale | ............... | F28F 21/02 |
| 2021/0337663 A1* | 10/2021 | Kishimoto | ............... | H05K 1/0298 |
| 2024/0027147 A1* | 1/2024 | Jeon | ............... | F28F 21/02 |

* cited by examiner

*Primary Examiner* — Herve-Louis Y Assouman
*Assistant Examiner* — Christopher M Roland
(74) *Attorney, Agent, or Firm* — Essential Patents Group, LLP

(57) ABSTRACT

A hybrid thermal interface material (TIM) suitable for an integrated circuit (IC) die package assembly. The hybrid TIM may include a heat-spreading material having a high planar thermal conductivity, and a supplemental material having a high perpendicular thermal conductivity at least partially filling through-holes within the heat-spreading material. The hybrid TIM may offer a reduced effective spreading and vertical thermal resistance. The heat-spreading material may have high compressibility (low bulk modulus or low hardness), such as a carbon-based (e.g., graphitic) material. The supplemental material may be of a suitable composition for filling the through-hole. The heat-spreading material, once compressed by a force applied through an IC die package assembly, may have a thickness substantially the same as that of the supplemental material such that both materials make contact with the IC die package and a thermal solution.

16 Claims, 9 Drawing Sheets

HYBRID THERMAL INTERFACE MATERIAL (TIM) WITH REDUCED 3D THERMAL RESISTANCE

BACKGROUND

Integrated circuit (IC) packaging is a stage of microelectronic device manufacture in which an IC that has been fabricated on a die (or chip) comprising a semiconducting material is encapsulated in an "assembly" or "package" that can protect the IC from physical damage and support electrical contacts that connect the IC to a host circuit board or another package. In the IC industry, the process of fabricating a package is often referred to as packaging, or assembly.

A number of IC packaging technologies include a heat spreader and/or heat sink, heat exchanger, or other types of thermal solutions. A heat spreader is to convey heat laterally and vertically away from an IC die to an external component, such as heat sink or heat exchanger (e.g., heat pipe, microfluidic cooler, etc.). The heat sink or heat exchanger is to dissipate heat originated by the IC, for example to the ambient environment or to a closed coolant loop. A heat spreader or heat sink/exchanger is typically a bulk metallic component, and not readily compressible, so a more compressible intermediary may be placed between the heat source (e.g., IC die) and the thermal solution so as to improve thermal conductivity between the two even if there is some amount of surface non-planarity in either (or both) of the components. This intermediary is often referred to as thermal interface material (TIM). A TIM may be in the form of viscous fluid, often referred to as a "thermal grease." A thermal grease can offer good thermal conductivity, but often suffers from instability as thermal cycles are experienced by the package assembly during IC operation can cause the fluid TIM to flow out or dry out. This instability typically leads to an increasing thermal resistance between the heat source and the heat spreader/sink over time.

An alternative TIM in the form of a solid pad comprises a material that is in a more stable solid/condensed phase, but still displays good thermal conductivity and is sufficiently compressible to accommodate some level of non-planarity. While recent material advances may help TIM preforms (i.e., pads) to become a robust thermal solution, the subset of TIM preforms that offer the lowest thermal resistance within a plane of the TIM (e.g., x-y plane) may have significant thermal resistance through the plane of the TIM (e.g., in the z-dimension).

A TIM preform having both a low planar and a low z-dimensional thermal resistance (i.e., a low 3D thermal resistance) is therefore commercially advantageous as such a TIM may enable longer IC device lifetimes in more extreme field environments, and/or higher IC device power densities, for example.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
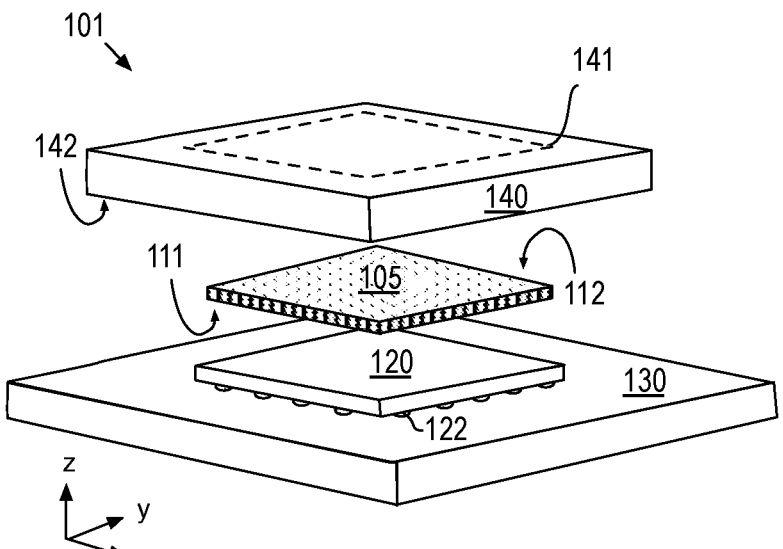
FIG. 1A illustrates an exploded isometric view of an IC die-heat spreader assembly including a hybrid TIM, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are examples of a hybrid TIM, which may be employed within a package assembly (e.g., single die, multi-die, 3D die stacks, etc.). In the examples below, features within a TIM having superior thermal spreading characteristics associated with high in-plane thermal conductivity (e.g., in a X-Y dimension) are at least partially filled with another TIM having a superior perpendicular thermal conductivity (e.g., in a Z dimension) to arrive at a hybrid TIM that has a high effective heat transfer rate both in-plane and out-of-plane (i.e., 3D). For embodiments where both the TIM materials are in the solid phase, the hybrid TIM has the further advantage of a being reworkable. For embodiments where a least one of the TIM materials has a low bulk modulus (i.e., low hardness), good contact can be made to a first component on a first side of the TIM and a second component on a second side of the TIM. Through selection of materials, as well as through the fabrication techniques enlisted to form the hybrid TIM, thermal contact resistance between materials of the hybrid TIM may be low.

FIG. 1A illustrates an isometric view of an IC die-integrated heat spreader assembly 101 including a hybrid TIM 105, in accordance with some embodiments. In the use case illustrated in FIG. 1A, hybrid TIM 105 is between an IC die 120 and an integrated heat spreader (IHS) 140 and may therefore be referred to as a first level TIM or a "TIM1". As shown, hybrid TIM 105 has a surface 111 with an area (e.g., X-Y plane) that defines a footprint of a dimensionalized preform or "pad." The footprint of hybrid TIM 105 may be any size suitable for a given IC die 120. For example, hybrid TIM 105 may have a footprint of a few square millimeters sufficient for contacting a small IC die, up to around 1000 mm$^2$, sufficient for contacting the majority of a large IC die surface, or multiple IC die surfaces, etc. TIM surface 111 is to be in direct contact with a surface of IC die 120. Hybrid TIM 105 has a second surface 112 that is to be in direct contact with a surface of IHS 140.

IHS 140 may be of one more materials having sufficient thermal conductivity, and may have any thickness suitable to provide sufficient package rigidity and/or protection to the underlying IC die 120 and hybrid TIM 105. IHS 140 may be a bulk metal, such as stainless steel or another sheet good that can be stamped, for example. IHS 140 may have a surface finish, such as Ni, for example. IHS 140 has a surface larger than the footprint of hybrid TIM 105 (denoted by dashed line 141) allowing for sidewall portions of IHS 140 to enclose IC die 120 and hybrid TIM 105. Dashed line 141 demarks an interior region of IHS 140 that is in contact with hybrid TIM surface 112, and more specifically in direct contact with multiple materials that make up hybrid TIM 105. As shown, heat spreader 140 further includes an exterior wall portion beyond dashed line 141, which includes a contact surface 142 that is to be affixed to substrate 130, for example with an adhesive sealant (not depicted) that forms a perimeter around IC die 120 and can hold IHS 140 against hybrid TIM 105 to maintain a compressive force or load on hybrid TIM 105.

IC die IHS assembly 101 includes a substrate 130, which may be any package substrate or a circuit board that may further include any number of conductive routing layers (not depicted). As further illustrated, IC die 120 is connected to substrate 130 by conductive interconnects 122. First level conductive interconnects (FLI) 122 may be any known to be suitable for electrically coupling an IC die, such as, but not limited to, solder features (e.g., solder balls, solder bumps, microbumps, pillars, etc.). IC die 120 may include one or more ICs, such as, but not limited to, power management ICs (PMICs), radio frequency communication ICs (RFICs), microprocessors (e.g., application processors, central processors, graphics processors), memory ICs (e.g., DRAM), or System on a Chips (SoCs) that may include two or more of these types of ICs, etc. In the illustrated example, only one IC die 120 is illustrated, however more than one IC die may be similarly interconnected to substrate 130.

Figure 1B:
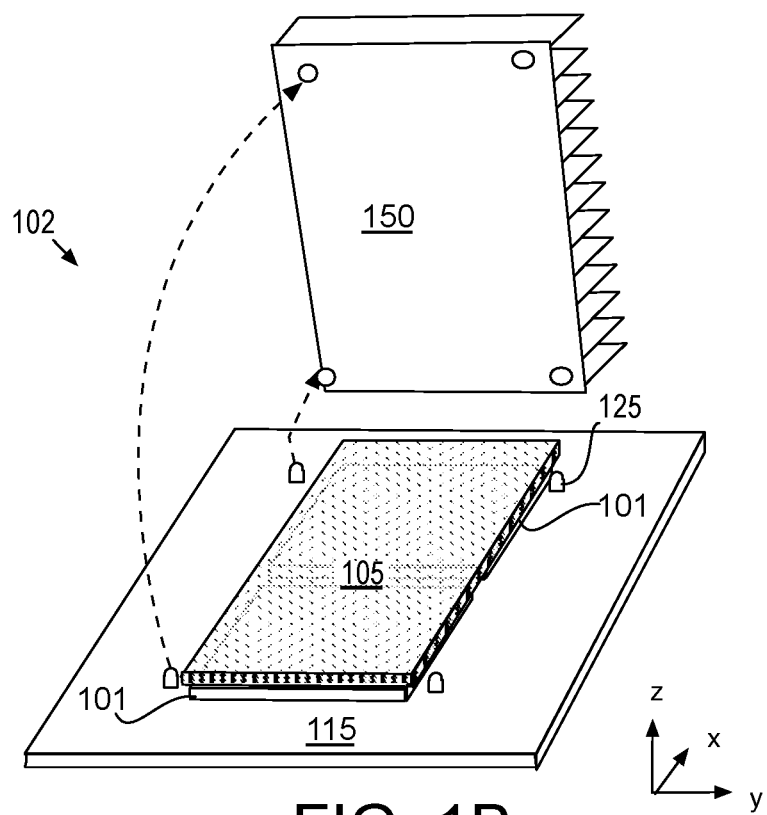
FIG. 1B illustrates an isometric view of an IC die-heat sink assembly including a hybrid TIM preform, in accordance with some embodiments.

FIG. 1B illustrates an isometric view of an IC package-heat sink assembly 102 including hybrid TIM preform 105, in accordance with some other embodiments. In the use case illustrated in FIG. 1B, hybrid TIM 105 is between IC die-heat spreader assembly 101 and a system-level thermal solution 150 and may therefore be referred to as a second-level TIM or "TIM2." IC package-heat sink assembly 102 may be incorporated in an electronic device, such as a laptop computer, smartphone, etc. In FIG. 1B, thermal solution 150 is a heat sink that is to dissipate heat from assembly 102. The heat sink is illustrated as having been lifted from mounts 125, showing a first and second underlying IC die-IHS assembly 101, which are further attached to a host circuit board 115. As shown, assembly 102 further includes another hybrid TIM preform 105, which may, for example, have been affixed to substantially coplanar surfaces of the IC assemblies 101. Hybrid TIM preform 105 may have been stamped out of a sheet good according to a predetermined stencil, for example, and aligned with mounts 125. Thermal solution 150, once in place on mounts 125, may be forced down, for example with threaded fittings (not depicted) torqued to apply a compression force that compresses hybrid TIM preform 105 to some predetermined thickness.

Figure 2A:
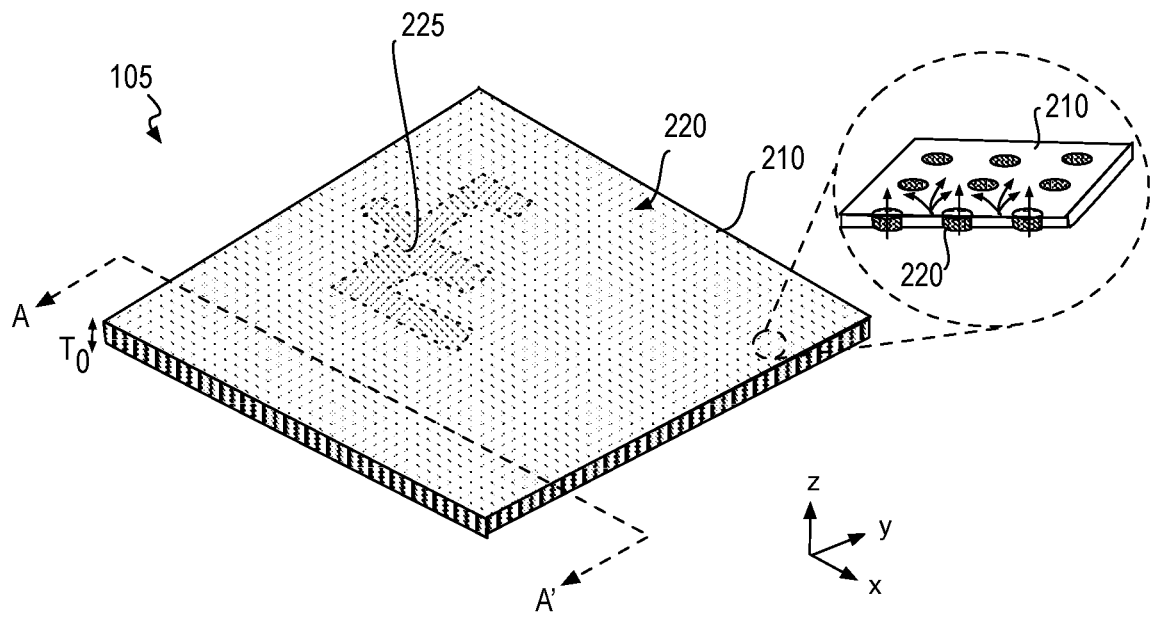
FIG. 2A illustrates an isometric view of a hybrid TIM preform, in accordance with some embodiments.

FIG. 2A illustrates an isometric view of hybrid TIM preform 105, in accordance with some embodiments. As shown, hybrid TIM preform 105 includes a heat-spreading material 210, which is contiguous and may therefore be considered the hybrid TIM substrate material. As illustrated in the expanded view inset, spreading material 210 has a high planar thermal conductivity so that heat within any region of spreading material 210 may be spread laterally to adjacent regions. Hybrid TIM preform 105 further includes a supplemental material 220 that is not contiguous, and instead occupies discrete features (e.g., holes or vias) that extend through at least a partial thickness of heat-spreading material 210. Although the discrete features are illustrated as substantially round (or cylindrical), other polygons are also possible (e.g., square holes, elongated holes, etc.). The discrete features of supplemental material 220 are to provide high thermal conductivity through the thickness of heat-spreading material 210. Heat-spreading material 210 has a higher thermal conductivity in the x/y dimensions ($\kappa xy$) than supplemental material 220, but thermal conduction in heat-spreading material 210 is anisotropic with $\kappa xy$ being significantly higher than the thermal conductivity in the z-dimension ($\kappa z$). As used herein, $\kappa$ is the thermal conductivity coefficient having SI units of W m-1 K-1. Thermal conductivity $\kappa z$ may be improved for hybrid TIM preform 105 through the inclusion of supplemental material 220 that has a higher z-dimensional thermal conductivity ($\kappa z$) than spreading material 210. In some embodiments, spreading material 210 has a planar thermal conductivity $\kappa xy$ exceeding 100 W m-1 K-1, and may be 500 W m-1 K-1, or more (e.g., 800-100 W m-1 K-1). In some further embodiments, supplemental material 220 has a perpendicular thermal conductivity xz exceeding 20 W m-1 K-1, and may be 100 W m-1 K-1, or more.

Noting that one or more of the IC package assembly components to which TIM preform 105 is to interface may have thickness non-uniformity, surface non-planarity, and/or surface roughness, heat-spreading material 210 advantageously has a relatively low bulk modulus that, when coupled with sufficient material thickness, will enable TIM preform 105 to accommodate irregularities between opposing package components by compressing significantly (e.g., 30-70%) under load. As compressed, the area of physical contact between components of an IC device assembly may be maximized. In some examples, spreading material 210 has a bulk modulus below 100 MPa, and advantageously 85 MPa, or less. Heat-spreading material 210 may also be characterized as having a low hardness or high compressibility. In some examples, heat-spreading material 210 has a hardness less than 100 on the Shore A scale.

Heat-spreading material 210 may have a wide variety of compositions that have both sufficient compressibility and planar thermal conductivity ($\kappa xy$). Heat-spreading material 210 is advantageously compositionally homogeneous. In some embodiments, heat-spreading material 210 is a composite, for example including one or more filler materials in a matrix material. In some embodiments, heat-spreading material 210 is carbon-based. In some carbon-based embodiments, heat-spreading material 210 is a graphitic material (e.g., crystalline graphite, pyrolytic graphite). Carbon-based materials may alternatively comprise nanotubes (e.g., with longitudinal lengths extending predominantly in the xy-plane).

Graphitic materials, particularly those within a suitable matrix material may have a low bulk modulus, displaying high compressibility (e.g., 40%, or more) at typical IC assembly pressures. Graphitic heat-spreading material may be in the form of a stack of 2D sheets oriented substantially orthogonal to material thickness T0. For embodiments where heat-spreading material 210 includes a matrix material, that matrix material may be a polymer, for example. While many polymers may be suitable, specific examples having high temperature stability include silicone-based polymers (i.e., polysiloxanes comprising silicon, oxygen, carbon), or synthetic rubbers. One specific example of a graphitic material suitable as heat-spreading material 210 is commercially available from Graftech, Inc. under the trade name of HITHERM (e.g., HT-C3200), which has a planar thermal conductivity $\kappa xy$ of approximately 800 Wm-1K-1.

Supplemental material 220 may similarly have a wide variety of compositions capable of providing a high perpendicular thermal conductivity $\kappa z$. Supplemental material 220 may, in some embodiments have a higher bulk modulus (e.g., over 100 MPa), and/or greater hardness (e.g., more than 100 Shore A and less than 100 Shore D) than heat-spreading material 210. Supplemental material 220 composition may also be limited by manufacturing constraints, for example limited to materials that can be deposited into holes within heat-spreading material 210. In some embodiments, supplemental material 220 is an elemental metal or metal alloy. Supplemental material 220 may include, for example, one or more of In, Au, Sn, Ag, Bi, Ga, or Cu. Such metals may be employed in a variety of solder alloys (e.g., solder-based TIM, etc.) and offer a perpendicular thermal conductivity xz potentially exceeding 100 W m-1 K-1, which compares favorably with many materials (e.g., graphitic preforms) that have been tuned to have particularly high planar thermal conductivity $\kappa cy$. For example, HT-C3200 has a perpendicular thermal conductivity xz significantly below 10 W/m K.

Notably, while supplemental material 220 is to be in solid phase when hybrid TIM 105 is free-standing, it may have a sufficiently low phase transition temperature that supplemental material 220 becomes liquid when hybrid TIM 105 is integrated into an IC device assembly and the assembly reaches an elevated temperature during operation. For example, some solder TIM (STIM) alloys known to be liquid metals at IC device operation temperatures may be utilized as supplemental material 220 with heat-spreading material 210 serving as a container for each feature (e.g., via) of supplemental material 220.

Integration of heat-spreading material 210 and supplemental material 220 may achieve a high effective 3D thermal conductivity with the two materials functioning substantially independently of each other (e.g., with supplemental material 220 responsible for good heat transfer in the z-direction while heat-spreading material 210 is responsible for lateral conduction through the interstitial areas where there is no supplemental material 220). The high effective 3D thermal conductivity may not rely on heat transfer between the two materials, so thermal resistance at the interface of materials 210 and 220 may not be a significant concern. However, because materials 220 and 210 are in direct contact minimizing thermal contact resistance between the two may be advantageous. As such, the composition of supplemental material 220 may be further constrained, for example as described further below.

Within heat-spreading material 210, supplemental material 220 may be arranged in a regular (e.g., rectangular grid) array of features having a fixed diameter and pitch, for example, to occupy a predetermined percentage of the surface area of hybrid TIM preform 105. Percent area density of supplemental material 220 may vary, for example as a function of the differences between κxy and κz for materials 210 and 220, the contact resistance between materials 210 and 220, and/or proximity to a known hot spot of an IC. In some examples, the supplemental material 220 has a percent area density ranging from 5% to less than 40%. Percent area density may not only vary across different TIM preforms designed for different IC die, but percent area density may vary within a single TIM preform. For example, in FIG. 2A percent area density is higher within a region 225 compared to a remainder of hybrid TIM preform 105. Region 225 may, for example, be positioned and dimensioned within TIM preform 105 to locally increase κz at the expense of κxy within region 225. There may be any number of regions within a TIM preform that include supplemental material 220 at any number of different area densities.

Figure 2B:
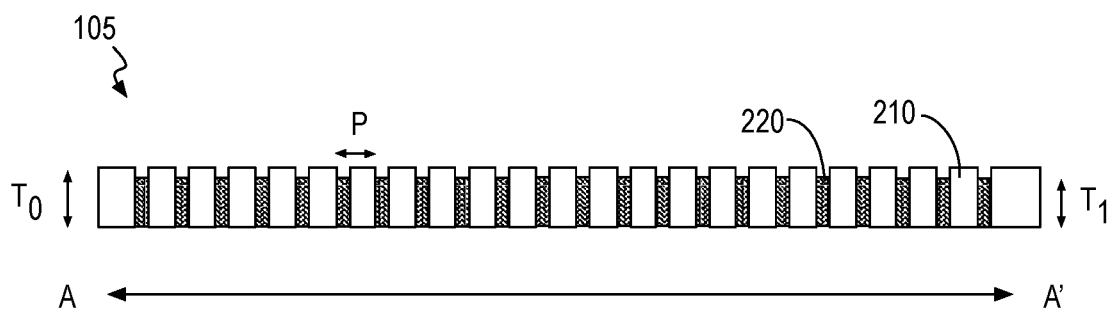
FIGS. 2B, 2C and 2D illustrate cross-sectional views of the hybrid TIM preform illustrated in FIG. 2A in accordance with some embodiments.
Figure 2C:
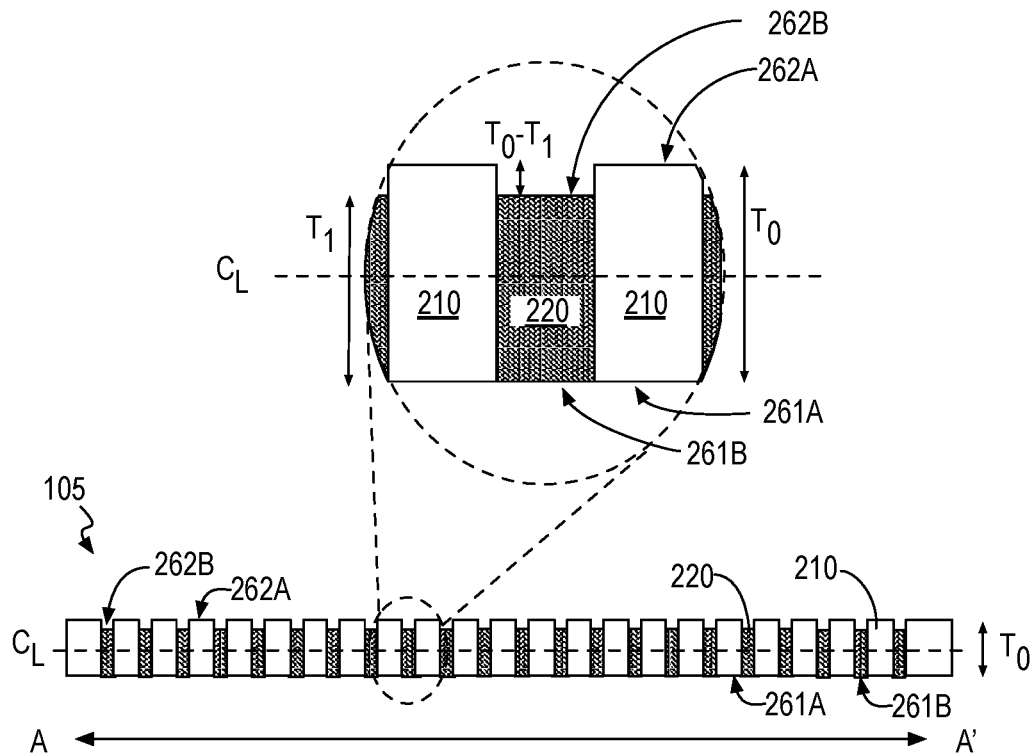
Figure 2D:
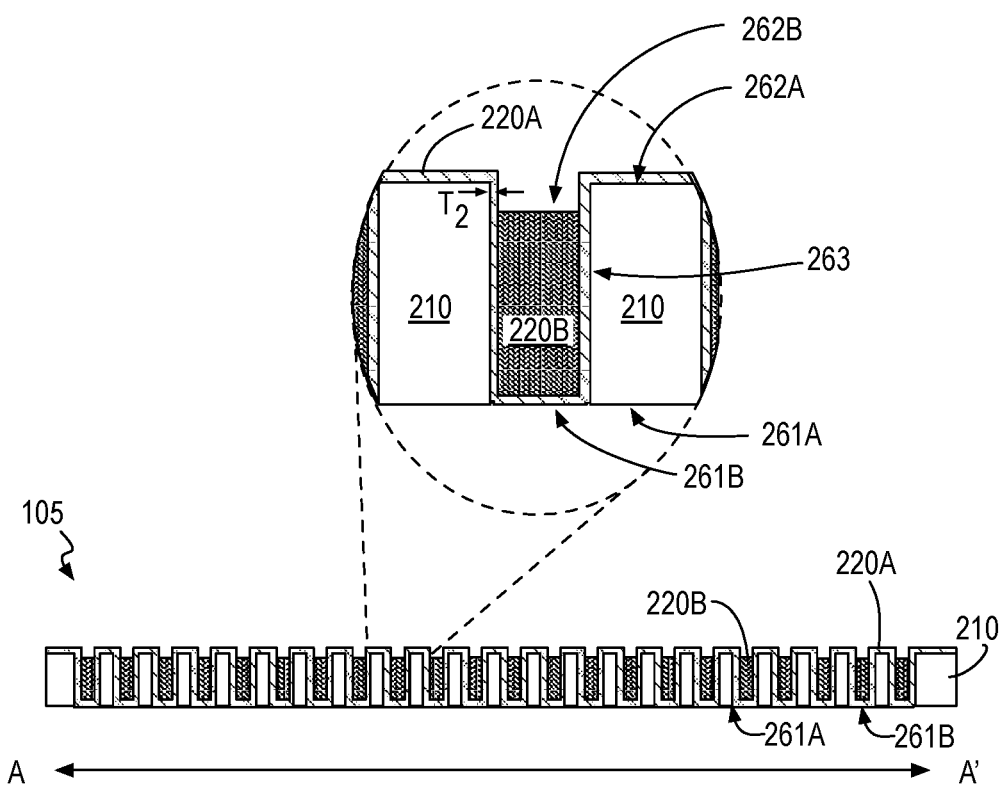

FIGS. 2B, 2C and 2D illustrate cross-sectional views of hybrid TIM preform 105, in accordance with some embodiments. As shown in FIG. 2B, spreading material 210 has a thickness T0. Thickness T0 may vary with implementation, but is advantageously sufficient to accommodate non-planarity and/or surface irregularities in one or more IC package components between which TIM preform 105 is to be integrated. In some examples thickness T0 is no more than 500 μm, and may more specifically fall within a range of 50-200 μm. Each instance of supplemental material 210 occupies at least a portion of a through-hole extending completely through thickness T0. One feature of supplemental material 220 may therefore be considered a thermally conductive via within heat-spreading material 210. As shown, thermal vias of supplemental material 220 have a pitch P that may vary, but in some examples is less than 200 μm, and may more specifically be within a range of 100-200 μm. The diameter of an individual supplemental material feature may also vary, but in some examples is less than 100 μm, and may more specifically be within a range of 50-100 μm.

As further illustrated in FIGS. 2B and 2C, features of supplemental material 220 have a thickness T1, which in the illustrated example is less than thickness T0. Thickness T1 is advantageously smaller by thickness T0 by an amount sufficient to accommodate differences in hardness/bulk modulus between heat-spreading material 210 and supplemental material 220. Thickness T1 may define a final bond line thickness (BLT) associated with hybrid TIM 105. Ideally, to ensure IC assembly components make direct contact with both heat-spreading material 210 and with exposed surfaces of supplemental material 220, the thickness difference T0−T1 should be approximately equal to an amount of compression heat-spreading material 210 is to undergo when integrated into a IC device assembly (e.g., under a compression force of 1-1000 kPa). In some embodiments, thickness T1 is less than thickness T0 by at least 10% of thickness T0, and may be less by 25-75% of thickness T0. For example, where heat-spreading material 210 has a thickness T0 of 200 μm, supplemental material may have a thickness T1 of only 50 μm, so that heat-spreading material 210 may be compressed to a 50 μm BLT.

As illustrated in FIG. 2C, the difference between thicknesses T0 and T1 may be manifested predominantly on one side of hybrid TIM 105. For example, a centerline through thickness T0 is not coincident with a centerline through thickness T1 because heat-spreading material 210 has a first (bottom) surface 261A that is substantially co-planar with a first (bottom) surface 261B of the features (e.g., vias) of supplemental material 220. The supplemental material vias therefore have a second (top) surface 262B that is recessed (e.g., by T0−T1) relative to the second (top) heat-spreading material surface 262A. Although illustrated as substantially planar, second surface 262B may instead have curvature (e.g., positive or negative) indicative of a slump profile associated with liquid surface tension.

As noted above, supplemental material 220 may have a composition and/or multi-layered structure that achieves a low contact resistance with spreading material 210. FIG. 2D illustrates one such embodiment where a multi-layered supplemental material includes a seed layer 220A in direct contact with heat-spreading material 210, and a fill layer 220B in direct contact with seed layer 220A. As shown, seed layer 220A is in direct contact with spreading material sidewall 263. In this example, seed layer 220A is also in direct contact with heat-spreading material top surface 262A. Supplemental material surface 262B is therefore recessed below the portion of seed layer 220A that is over top surface 262A. Seed layer 220A is substantially coplanar with bottom surface 261A (i.e., with seed layer 220A on bottom surface 261B so that top surface 262B is the only exposed surface of fill material 220B. For this exemplary embodiment, heat-spreading material 210 is again contiguous but with one layer of supplemental material coating one side of heat-spreading material 210 and a second layer of supplemental material residing within the openings in heat-spreading material 210, and recessed below at least the side of heat-spreading material 210 that is coated by the first layer of supplemental material. As described further below, such a structure is indicative of a single-sided deposition of supplemental material onto heat-spreading material 210. While the presence of seed layer 220A over top surface 262A may reduce contact resistance between heat-spreading material 210 and an IC assembly component that interfaces with top surface 262A through seed layer 220A, seed layer 220A may also be absent from top surface 262A.

Seed layer 220A may comprise any material that has an advantageously low thermal contact resistance with heat-spreading material 210. In some exemplary embodiments where heat-spreading material 210 comprises graphitic material, seed layer 220A comprises a layer of predominantly copper. Copper, particularly electrolytic copper, adheres well to graphite and has a low contact resistance with graphite. Seed layer 220A may also, or in the alternative, comprise other materials, such as other metals, non-metals (e.g., diamond-like carbon), or metalloids (e.g., metal carbides, metal nitrides, etc.) that may offer improved adhesion and/or thermal coupling with heat-spreading material 210.

Seed layer 220A may be substantially conformal, or not. Seed layer thickness T2 on sidewall 263 is advantageously at least a few tens of nanometers (e.g., 40-50 nm), which is usually sufficient to ensure a continuous coating (e.g., no pinholes) over heat-spreading material 210. The remainder of the feature (e.g., via) may be occupied by fill layer 220B. In the presence of seed layer 220A, there may be greater freedom in selecting the composition of fill layer 220B. Fill layer 220B may, for example, include one or more of In, Au, Sn, Bi, Ag, Ga, or Cu. In some exemplary embodiments where heat-spreading material 210 is graphitic and seed layer 220A is predominantly copper, fill layer 220B is an indium-based solder alloy.

Figure 3:
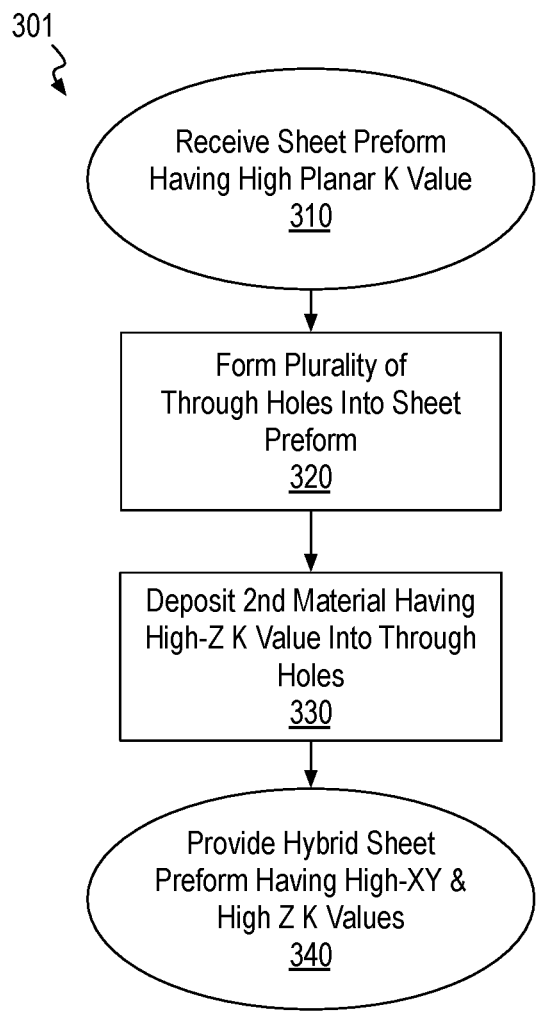
FIG. 3 illustrates a flow diagram of methods forming a hybrid TIM preform, in accordance with some embodiments.

FIG. 3 illustrates a flow diagram of methods 301 for forming a hybrid TIM preform, in accordance with some embodiments. FIG. 4A-4G illustrate a hybrid TIM preform evolving as methods 301 are practiced in accordance with some exemplary embodiments.

Referring first to FIG. 3, methods 301 begin at input 310 where a sheet preform having a high planar thermal conductivity is received. In some carbon-based examples where the substrate or base material comprises a graphitic filler in a polymer matrix, commercial sources include GrafTec, Inc., Panasonic Corporation of North America, or Hitachi Chemical, Corp. Alternatively, the sheet preform may be fabricated in-house upstream of methods 301. In the example illustrated in FIG. 4A, a sheet of heat-spreading material 210 has been received and placed upon a workpiece support 401. As further illustrated in FIG. 4B, heat-spreading material 210 is substantially homogeneous and featureless over its entire area and thickness T0.

Returning to FIG. 3, methods 301 continue at block 320 where a plurality of through holes are formed in the sheet preform. In some embodiments, block 320 entails laser drilling holes through the sheet preform. In some other embodiments, mechanical drilling, die stamping, water-jet drilling, or chemical etching of the sheet material may be practiced at block 320. In the example further illustrated in FIG. 4C, a laser drilling process has ablated open holes 410 completely through thickness T0. Such a drilling process may be performed without a mask by rastering a laser over a predetermined path. For chemical etching embodiments, a mask material (not depicted) may first be applied to a top surface of heat-spreading material 210, opposite workpiece support 401, and patterned. Unmasked regions of heat-spreading material 210 may then be removed by chemical (e.g., plasma) etch.

With features (e.g., through holes) having been formed in heat-spreading material 210, methods 301 (FIG. 3) continue at block 330 where a supplemental material is deposited upon the heat-spreading material, at least partially filling the features. Block 330 may entail one or more deposition processes that may deposit one or more material layers onto the heat-spreading material. In some embodiments, block 330 entails at least one of physical vapor deposition (PVD), chemical vapor deposition (CVD), electroless plating, electrolytic plating, solder dispensing, or powder dispensing. In the example further illustrated in FIG. 4D, one or more deposition processes have been performed to deposit seed layer 220A into through holes 410. As shown, a contiguous seed layer 220A has been coated over heat-spreading material 210, contacting workpiece support 401 at the bottom of through holes 410. In some exemplary embodiments, seed layer 220A is formed with a flash PVD process or electroless plating process followed by an electrolytic plating process. Such embodiments would be suitable, for example, to deposit a predominantly copper seed layer 220A. For alternative materials, CVD or exclusively PVD processes may be practiced to deposit seed layer 220A.

Figure 4A:
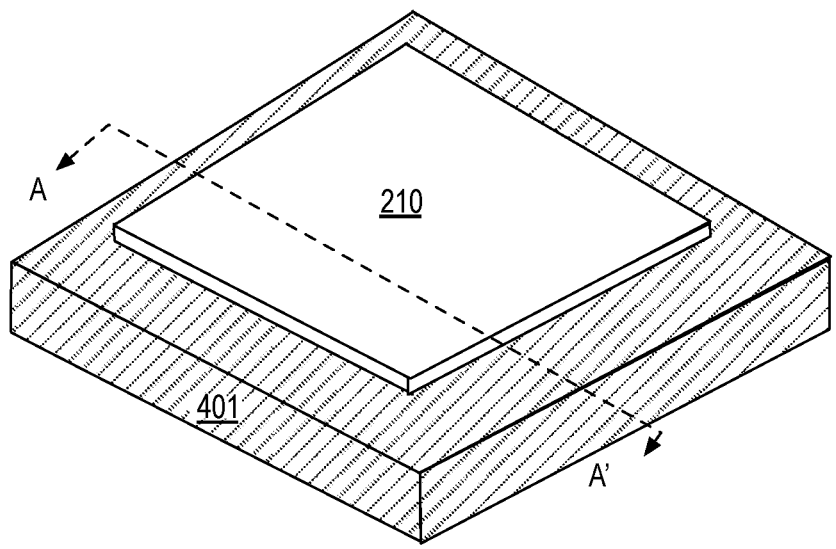
FIG. 4A illustrates an isometric view of a homogeneous TIM preform, in accordance with some embodiments.
Figure 4B:
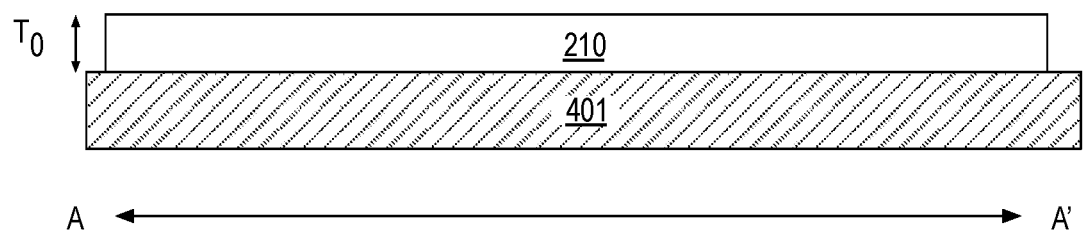
FIG. 4B illustrates a cross-sectional view of the TIM preform illustrated in FIG. 4A, in accordance with some embodiments.
Figure 4C:
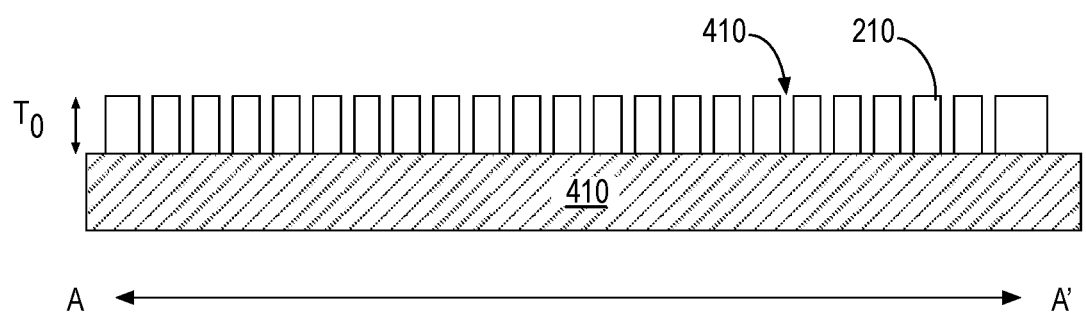
FIG. 4C illustrates a cross-sectional view of the TIM preform illustrated in FIG. 4B following the formation of through-holes, in accordance with some embodiments.
Figure 4D:
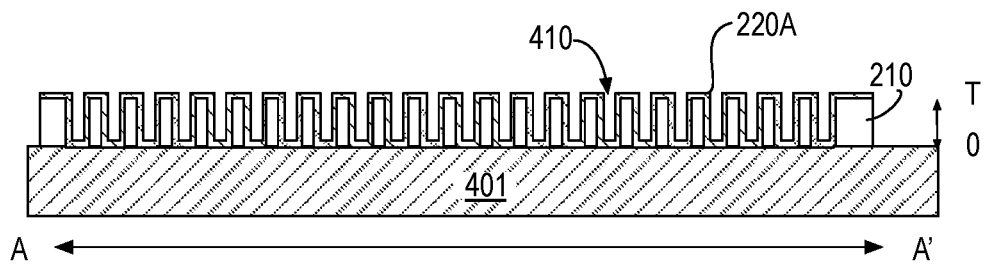
FIG. 4D illustrates a cross-sectional view of the TIM preform illustrated in FIG. 4C following deposition of a seed layer, in accordance with some embodiments.
Figure 4E:
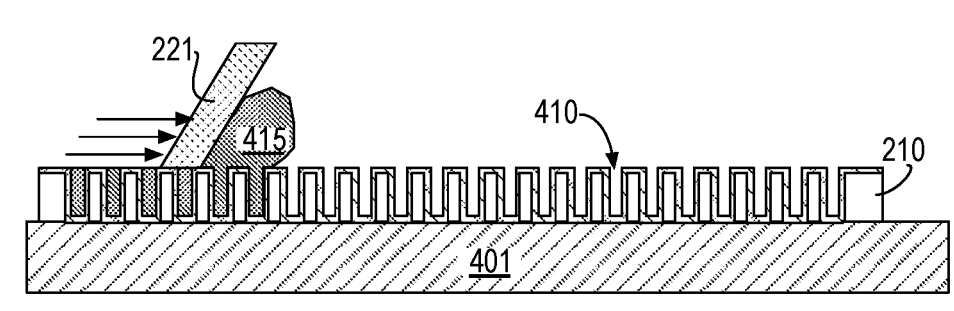
FIG. 4E illustrates an application of solder paste to the TIM preform illustrated in FIG. 4D, in accordance with some embodiments.
Figure 4F:
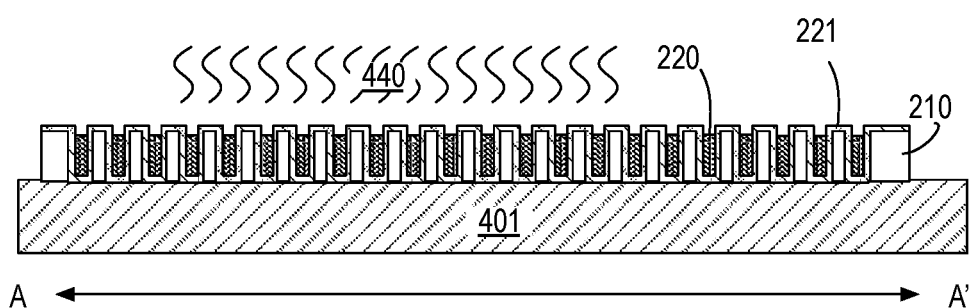
FIG. 4F illustrates a reflow of solder paste in a hybrid TIM preform, in accordance with some embodiments.

FIG. 4E illustrates an embodiment where block 330 further includes a solder paste dispense. During dispense, a solder paste 415 may be printed with a stenciless process, for example with squeegees 221 applying solder paste 415 to a uniform fill level within through holes 410. The paste includes flux suspending particles of solder having the alloy composition desired for the supplemental material. Following paste dispense, a reflow of the paste is performed to remove the volatile flux component (e.g., as further illustrated in FIG. 4F) to arrive at supplemental material 220. The solder reflow may be performed in a heated ambient 440 suitable for the solder paste composition. For example, a soak temperature, time and peak temperature may be selected based on the solder particle alloy composition. As shown in FIG. 4F, removal of the flux component results in a controlled amount of slump in supplemental material 220 so that the various features of supplemental material will have a height or thickness T1 that is highly uniform.

Other solder dispense embodiments are also possible, for example microballs may be dispensed into holes 410, for example using one or more microball brush dispenser. For any alternative solder dispense techniques, a solder reflow as illustrated in FIG. 4F may be similarly practiced to arrive at a controlled thickness of supplemental material 220.

Plating may be relied upon exclusively, for example where only one material layer is to fill through holes 410 (e.g. as shown in FIG. 4C). In some plating embodiments, a modified PCB through hole plating process is employed, which completely fills the through holes with plated material. As one example, workpiece support 401 may be removed and the sheet preform placed in a plating bath in which periodic pulse reverse electroplating is first employed to bridge in the middle of the hole with copper. Direct current electroplating may then be practiced to fill the vias on opposite sides of the bridge. Overburden from such a process may be removed from one or both sides of the sheet preform with a polish and/or grind process (with the sheet preform again supported by a planar workpiece support 401).

Figure 4G:
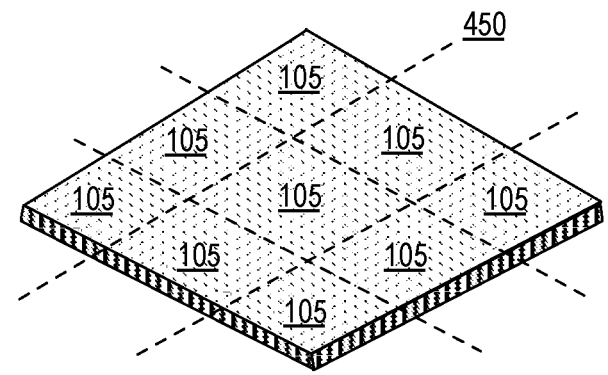
FIG. 4G illustrates singulation of a hybrid TIM preform, in accordance with some embodiments.

Methods 301 (FIG. 3) may end at output 340 where a hybrid TIM sheet preform having high 3D thermal conductivity is provided. In the example further illustrated in FIG. 4G illustrates, a hybrid TIM preform is singulated along stamp lines 450 to provide individual hybrid TIM preforms 105 sized appropriately for a given IC device application where hybrid TIM preform 105 may be employed as a TIM1 or TIM2.

Figure 5A:
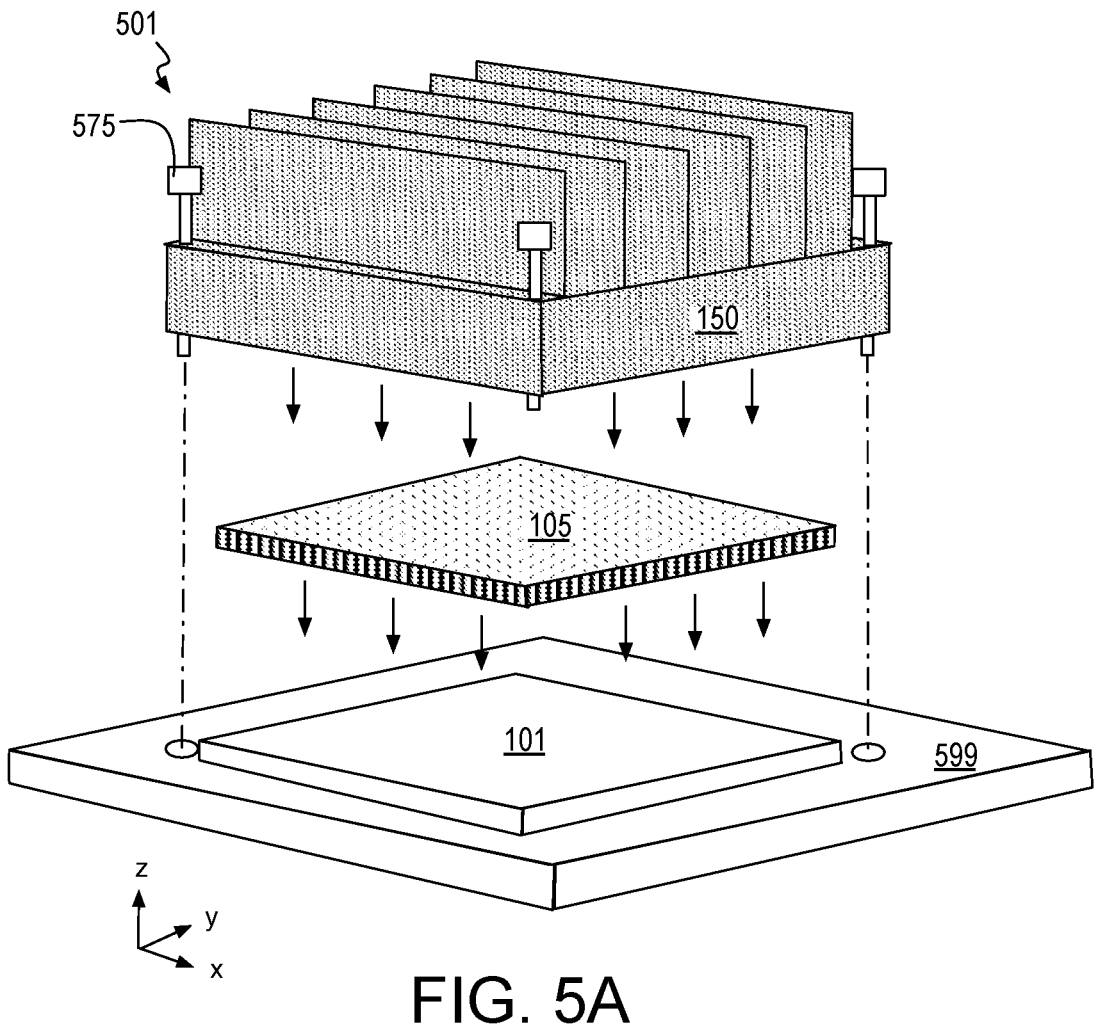
FIG. 5A illustrates an exploded isometric view of an assembly of a microelectronic system including a hybrid TIM preform, in accordance with some embodiments.
Figure 5B:
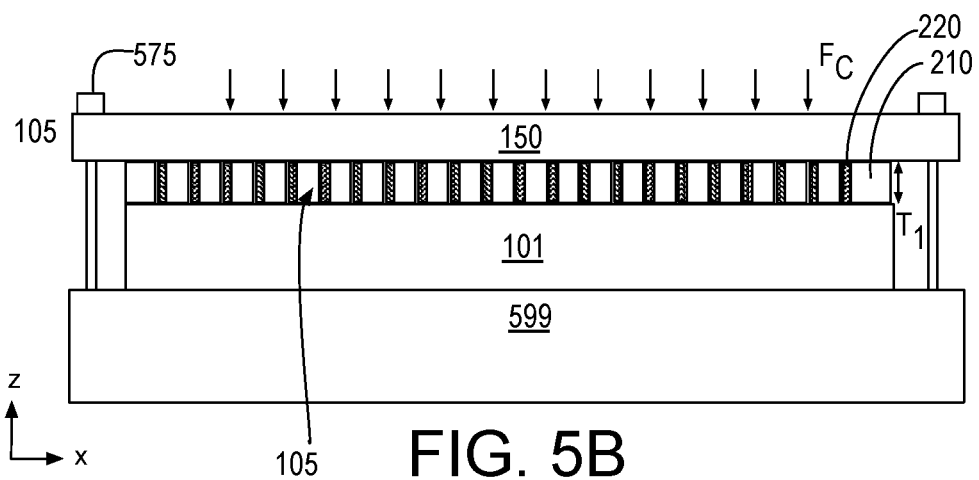
FIG. 5B illustrates a cross-sectional view of a microelectronic system including a hybrid TIM preform, in accordance with some embodiments.

In some embodiments, an IC device further includes at least one hybrid TIM, for example having one or more of the attributes described above. FIG. 5A illustrates an exploded isometric view of an assembly of a microelectronic system 501 including hybrid TIM preform 105, in accordance with some embodiments. The exploded view illustrates hybrid TIM preform 105 being applied to contact an exposed surface of IC assembly 101, and thermal solution 150 is applied to contact a side of hybrid TIM preform 105 opposite IC assembly 101. Depending on the embodiment, thermal solution 150 may be a heat sink, a cold plate, a microfluidic cooling device, or any other system-level thermal solution. In the example shown, mechanical couplers 575 (e.g., screws, pins, etc.) are aligned to mating receptacles in a PCB 599. During assembly, mechanical couplers 575 are to apply a compressive force Fc to hybrid TIM 105, for example as further illustrated in FIG. 5B. Force Fc (e.g., in the range of 1-1000 kPa) compresses hybrid TIM 105, and more specifically compresses heat-spreading material 210, from an initial thickness T0 to a final thickness T1. With mechanical couplers 575 at a desired torque specification, supplemental material 220 is in direct contact with at least heat sink 150.

For alternative embodiments where a hybrid TIM is to be placed between an IC die and an integrated heat spreader (IHS), the heat spreader may be brought into contact with the hybrid TIM preform, for example with a pick-and-place machine that compresses the heat spreader against the hybrid TIM preform and a perimeter sealant bead. The sealant is then cured to maintain a compressive force on the hybrid TIM preform.

Figure 6:
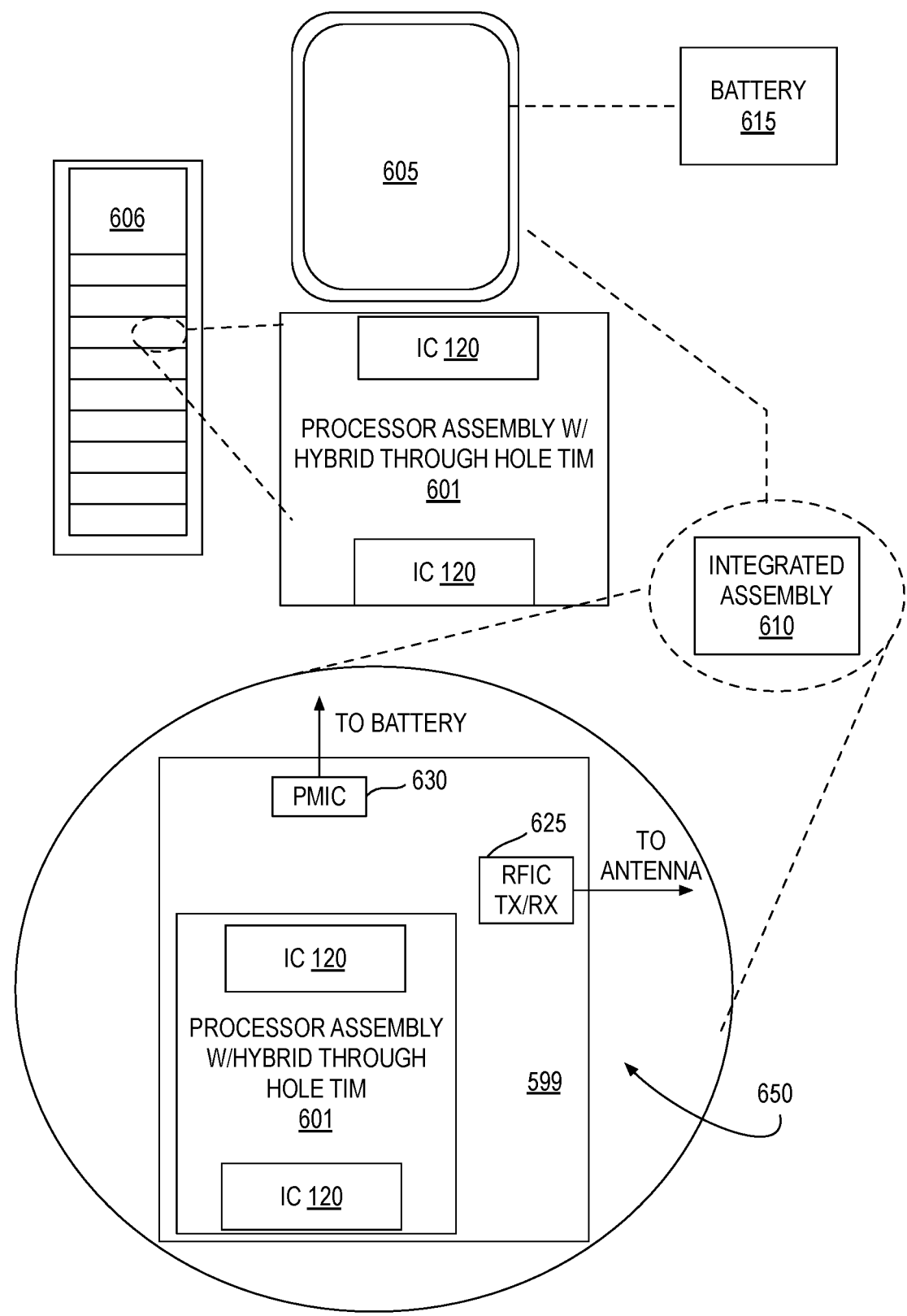
FIG. 6 illustrates a mobile computing platform and a data server machine employing an IC assembly including a hybrid TIM pad, in accordance with some embodiments.

FIG. 6 illustrates a mobile computing platform and a data server machine employing an IC package assembly including a hybrid TIM, for example as described elsewhere herein. In some further embodiments, a hybrid TIM is between IC assembly 101 (e.g., processor and/or memory IC integrated with an IHS) and a component of the package assembly, such as an IHS. In other embodiments, a hybrid TIM is between IC assembly 101 and a system-level thermal solution, such as a heat sink or heat exchanger. The server machine 606 may be any commercial server, for example including any number of high-performance computing platforms disposed within a rack and networked together for electronic data processing, which in the exemplary embodiment includes a packaged assembly 650 that further includes a hybrid TIM, for example as described elsewhere herein. The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), a chip-level or package-level integrated assembly 610, and a battery 615.

Processor assembly 601 includes IC die 101 (e.g., a memory IC and processor IC) and further includes a hybrid TIM, for example as described elsewhere herein. The hybrid TIM may be further between IC die and another assembly component, such as an IHS or heat sink, for example as descried elsewhere herein. Assembly 610 may be further coupled to a board 599, a substrate, or an interposer, one or more of a power management integrated circuit (PMIC) 630, RF (wireless) integrated circuit (RFIC) 625 including a wideband RF (wireless) transmitter and/or receiver (TX/RX) (e.g., including a digital baseband and an analog front end module further comprises a power amplifier on a transmit path and a low noise amplifier on a receive path).

Functionally, PMIC 630 may perform battery power regulation, DC-to-DC conversion, etc., and so has an input coupled to battery 615 and with an output providing a current supply to other functional modules. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

Figure 7:
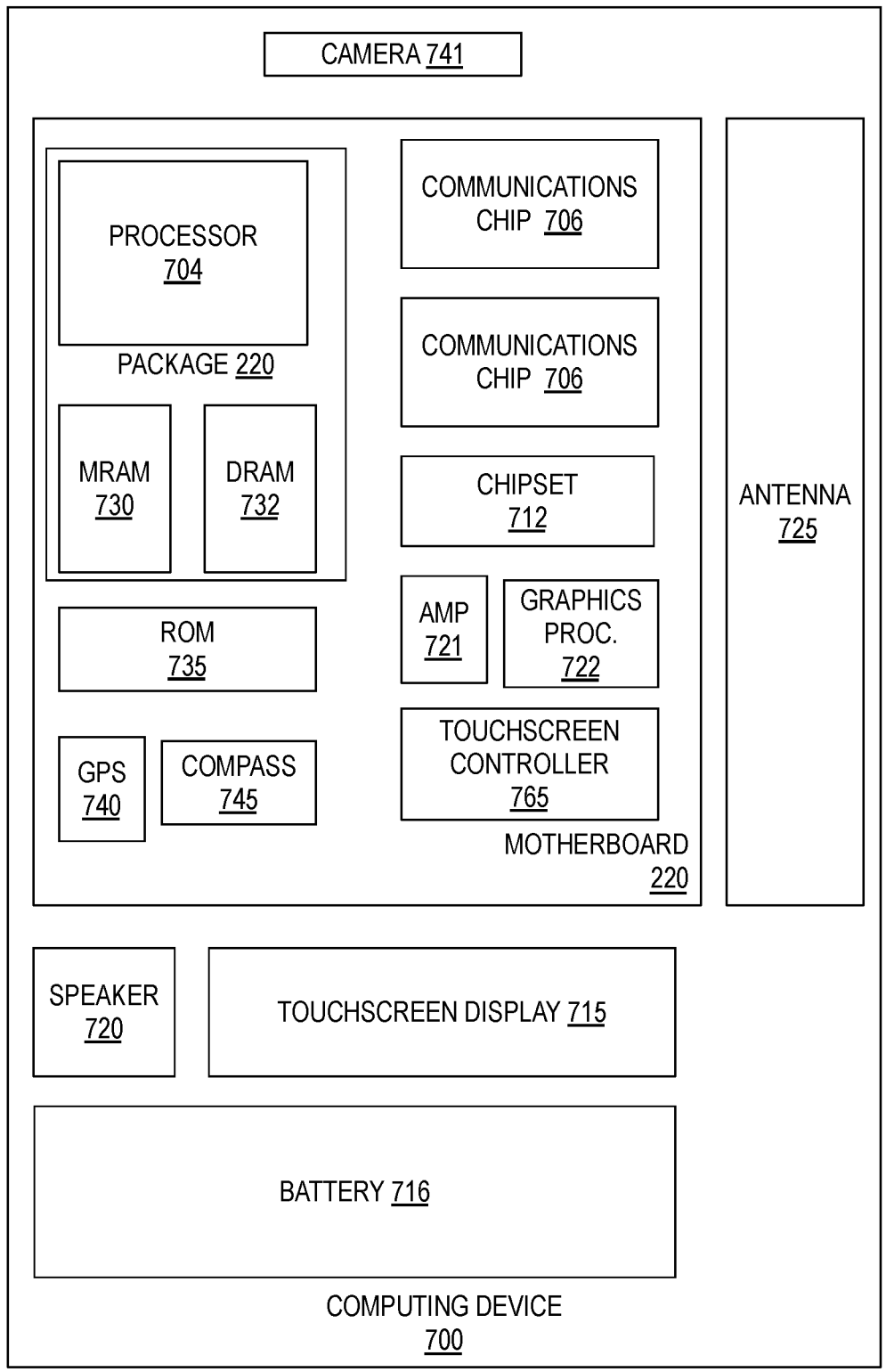
FIG. 7 is a functional block diagram of an electronic computing device, in accordance with some embodiments.

FIG. 7 is a functional block diagram of an electronic computing device 700, in accordance with an embodiment of the present invention. Computing device 700 may be found inside platform 605 or server machine 606, for example. Device 700 further includes a motherboard 702 hosting a number of components, such as, but not limited to, a processor 704 (e.g., an applications processor). Processor 704 may be physically and/or electrically coupled to motherboard 702. In some examples, processor 704 includes an integrated circuit die packaged with a hybrid TIM. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth), or the like. In some exemplary embodiments, at least one of the functional blocks noted above comprise an IC package assembly including a hybrid TIM, for example as described elsewhere herein.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including but not limited to those described elsewhere herein. As discussed, computing device 700 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first embodiments, a hybrid thermal interface material (TIM) preform comprises a first material comprising graphite, and a second material within a plurality of through-holes in the first material, wherein the second material has a different composition than the first material.

In second embodiments, for any of the first embodiments, the first material has a first thickness in a z-dimension, the first material has a planar thermal conductivity in an x-y plane ($\kappa xy$) exceeding that of the second material, and the second material has a thermal conductivity in the z-dimension ($\kappa z$) exceeding that of the first material.

In third embodiments, for any of the second embodiments $\kappa xy$ is at least 500 W/m K and $\kappa z$ is at least 20 W/m K.

In fourth embodiments, for any of the first through third embodiments the second material has a second thickness, less than the first thickness.

In fifth embodiments for any of the fourth embodiments the first thickness is less than 500 µm and the second thickness is less than the first thickness by at least 10% of the first thickness.

In sixth embodiments, for any of first through fifth embodiments, a first surface of the second material is substantially coplanar with a first surface of the first material, and wherein a second surface of the second material, opposite the first surface, is recessed from a second surface of the first material by a distance substantially equal to a difference between the first thickness and the second thickness.

In seventh embodiments, for any of the first through sixth embodiments, a first surface of the second material is substantially coplanar with a first surface of the first material, and a second surface of the second material, opposite the first surface, is recessed from a second surface of the first material by at least 10% of the first thickness.

In eighth embodiments, for any of the seventh embodiments, the first material has a first hardness and the second material has a second hardness, greater than the first hardness.

In ninth examples, for any of the eighth examples the first hardness is less than 100 Shore A.

In tenth examples, for any of the first through ninth examples the plurality of through-holes have an area density of between 5% and 40% within at least a portion of the preform.

In eleventh examples, for any of the first through tenth examples the individual ones of the through holes have a diameter of no more than 100 µm and a pitch between two adjacent one of the through holes is no more than 250 µm.

In twelfth examples, for any of the first through eleventh examples the second material comprises one or more metals.

In thirteenth examples, for any of the twelfth examples the one or more metals comprise at least one of Cu, Au, Ag, In, Bi, Ga, or Sn.

In fourteenth examples for any of the first through thirteenth examples the second material comprises a first layer on a sidewall of the through-hole and in contact with the first material, and wherein the first layer is between the first material and a metal within the through-hole.

In fifteenth examples, for any of the first through fourteenth examples the first material comprises a filler in a matrix, the filler comprising graphite, and the matrix comprising a polymer.

In sixteenth examples, an integrated circuit (IC) assembly comprises an IC die, a heat spreader, and a hybrid thermal interface material (TIM) between the IC die and the heat spreader. The hybrid TIM stack further comprises a first material comprising graphite, and a second material within a plurality of through-holes in the first material, wherein the second material has a different composition than the first material.

In seventeenth examples, a computer platform comprises a power supply, and the IC assembly of the sixteenth examples coupled to the power supply.

In eighteenth examples, a method of fabricating a hybrid thermal interface material (TIM) comprises receiving a sheet of a first material comprising graphite and having a first thickness. The method comprises forming a plurality of holes through the first thickness of the first material, and at least partially filling the holes with a second material.

In nineteenth examples, for any of the eighteenth examples forming the plurality of holes further comprises at least one of laser ablating the first material, mechanical drilling the first material, or masking and chemical etching the first material.

In twentieth examples, for any of the nineteenth examples filling the holes with the second material further comprises at least one of electrolytic plating the second material, or dispensing a powder, paste or microballs into the holes and reflowing the powder, paste, or microballs into the second material.

In twenty-first examples, a method of assembling an integrated circuit (IC) package comprises receiving a packaged IC die affixed to a substrate and affixing a first surface of a hybrid thermal interface material (TIM) to a top surface of the packaged IC die. The hybrid TIM comprises a first material comprising graphite, and a second material within a plurality of through-holes in the first material. The second material has a different composition than the first material. The method further comprises positioning a component over a second surface of the hybrid TIM, and applying a force to compress the first material between the component and the top surface of the packaged IC die until the component or top surface makes contact with the second material.

In twenty-second examples, for any of the twenty-first examples the component is a heat sink, heat exchanger, heat pipe, or microfluidic cooling device and at least one surface of the second material is substantially coplanar with a surface of the first material.

In twenty-third examples, for any of the twenty-first through twenty-second examples the first material has a first thickness less than 500 µm. The second material has a second thickness less than the first thickness by at least 10% of the first thickness. The first material has a planar thermal conductivity, $\kappa xy$, of at least 500 W/m K. The second material has a thermal conductivity in the z-dimension, $\kappa z$, of at least 20 W/m K.

In twenty-fourth examples, for any of the twenty-first through twenty-third examples the first material has a first hardness less than 100 Shore A, and the second material has a second hardness of exceeding 100 Shore A and less than 100 Shore D.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A hybrid thermal interface material (TIM) preform, comprising:
    a first material comprising graphite and having a first thickness in a z-dimension less than 500 µm; and
    a second material within a plurality of through-holes in the first material, wherein:
        the second material comprises a metal with a planar thermal conductivity in an x-y plane ($\kappa_{xy}$) less than that of the first material and a thermal conductivity in the z-dimension ($\kappa_z$) exceeding that of the first material;
        the second material has a second thickness, less than the first thickness by at least 10% of the first thickness;
        a first surface of the second material is substantially coplanar with a first surface of the first material; and
        a second surface of the second material, opposite the first surface of the second material, is recessed from a second surface of the first material by at least 10% of the first thickness.

2. The hybrid TIM preform of claim 1, wherein $\kappa_{xy}$ is at least 500 W/m K and $\kappa_z$ is at least 20 W/m K.

3. The hybrid TIM preform of claim 1, wherein the second surface of the second material is recessed from the second surface of the first material by a distance substantially equal to a difference between the first thickness and the second thickness.

4. The hybrid TIM preform of claim 1, wherein:
    the first material has a first hardness; and
    the second material has a second hardness, greater than the first hardness.

5. The hybrid TIM preform of claim 4, wherein the first hardness is less than 100 Shore A.

6. The hybrid TIM preform of claim 1, wherein the plurality of through-holes have an area density of between 5% and 40% within at least a portion of the preform.

7. The hybrid TIM preform of claim 1, wherein individual ones of the through-holes have a diameter of no more than 100 µm and a pitch between two adjacent one of the through-holes is no more than 250 µm.

8. The hybrid TIM preform of claim 1, wherein the second material is one or more metals.

9. The hybrid TIM preform of claim 8, wherein the one or more metals comprise at least one of Cu, Au, Ag, In, Bi, Ga, or Sn.

10. The hybrid TIM preform of claim 1, wherein the first material comprises a filler in a matrix, the filler comprising graphite, and the matrix comprising a polymer.

11. A hybrid thermal interface material (TIM) preform, comprising:
    a first material comprising graphite; and
    a second material within a plurality of through-holes in the first material, wherein the second material comprises a metal, and wherein the second material comprises a first layer on a sidewall of individual ones of the through-holes and in contact with the first material, and wherein the first layer is between the first material and a metal within individual ones of the through-holes.

12. An integrated circuit (IC) assembly, comprising:
    an IC die;
    a heat spreader; and
    the hybrid thermal interface material (TIM) perform of claim 1 between the IC die and the heat spreader.

13. A computer platform comprising:
    a power supply; and
    the IC assembly of claim 12 coupled to the power supply.

14. A hybrid thermal interface material (TIM) preform, comprising:
    a first material comprising graphite; and
    a second material within a plurality of through-holes in the first material, wherein the second material has a different composition than the first material, wherein the second material comprises a first layer on a sidewall of individual ones of the through-holes and in contact with the first material, and wherein the first layer is between the first material and a metal within individual ones of the through-holes.

15. The hybrid TIM preform of claim 14, wherein the metal comprises at least one of Cu, Au, Ag, In, Bi, Ga, or Sn.

16. The hybrid TIM preform of claim 14, wherein the second material is predominantly copper.

* * * * *